United States Patent [19]

Arcus

[11] Patent Number: 4,876,517

[45] Date of Patent: Oct. 24, 1989

[54] CIRCUIT FOR SENSING FET OR IGBT DRAIN CURRENT OVER A WIDE DYNAMIC RANGE

[75] Inventor: Christopher G. Arcus, San Jose, Calif.

[73] Assignee: Ixys Corporation, San Jose, Calif.

[21] Appl. No.: 208,290

[22] Filed: Jun. 17, 1988

[51] Int. Cl.[4] .............................................. H03F 3/16
[52] U.S. Cl. ..................................... 330/277; 307/530
[58] Field of Search ................. 307/530; 330/253, 257, 330/277, 288, 307, 311

[56] References Cited

U.S. PATENT DOCUMENTS 4,507,572   3/1985   Hashimoto et al. ............. 330/277 X
4,593,380   6/1986   Kocher et al. ....................... 364/900

Primary Examiner—Steven Mottola
Attorney, Agent, or Firm—Townsend and Townsend

[57] ABSTRACT

A current sensing circuit includes a pair of power devices connected in parallel. The mirror terminal of the first power device is coupled to a small sense resistance, and the mirror terminal of the second power device is connected to a large sense resistance. Each mirror terminal is coupled to its own comparator. Small currents are sensed by the comparator coupled to the mirror terminal of the first power device, and large currents are sensed by the comparator coupled to the mirror terminal of the second power device. If multiple mirror terminals are not available, a large sense resistance may be connected to the mirror terminal of the power device, and a small sense resistance may be selectively connected in parallel with the large resistance to provide low current-sensing capabilities. Accuracy of the device is enhanced by circuitry which minimizes the effect of integrated impedance variation and a variation in the low sense resistances.

18 Claims, 4 Drawing Sheets

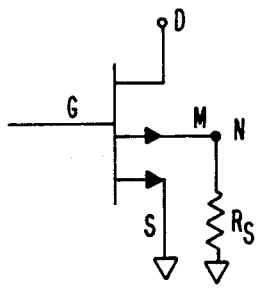
FIG._1A. PRIOR ART
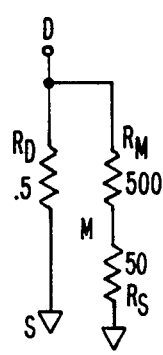
FIG._1B.
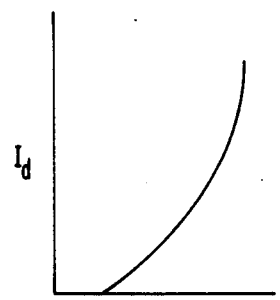
FIG._2.
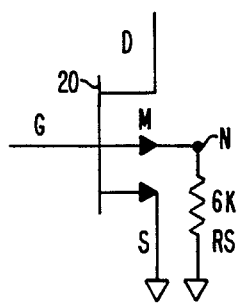
FIG._5.
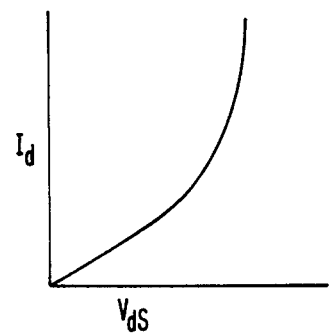
FIG._6.
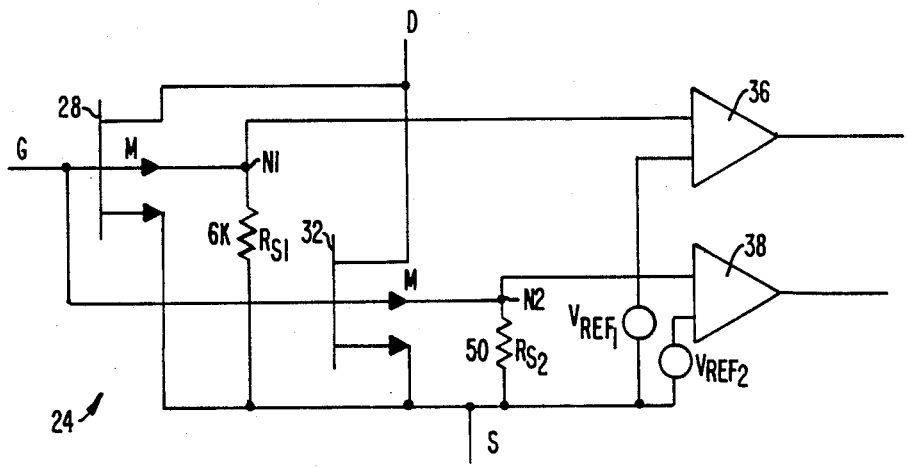
FIG._7.

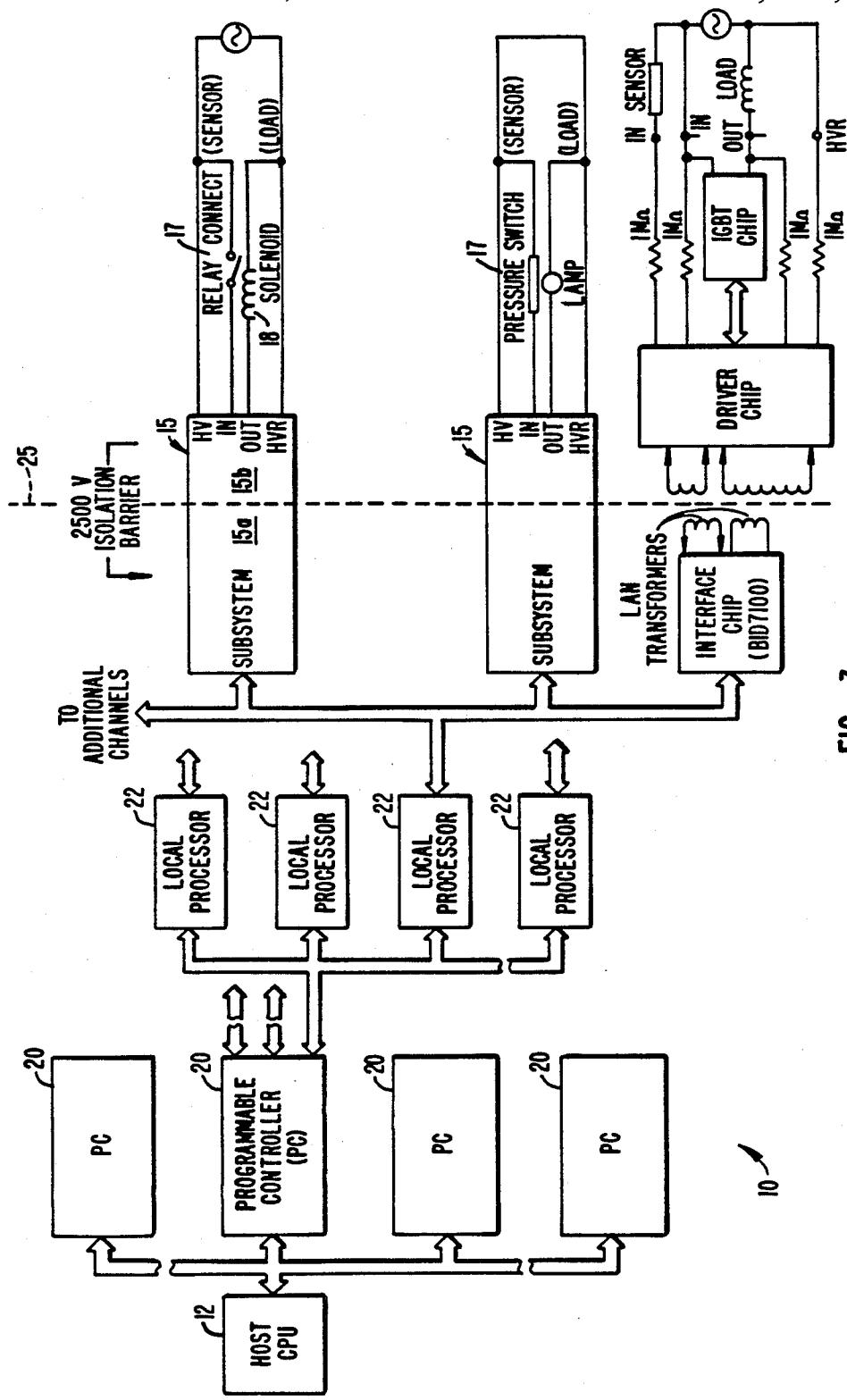
FIG._3.

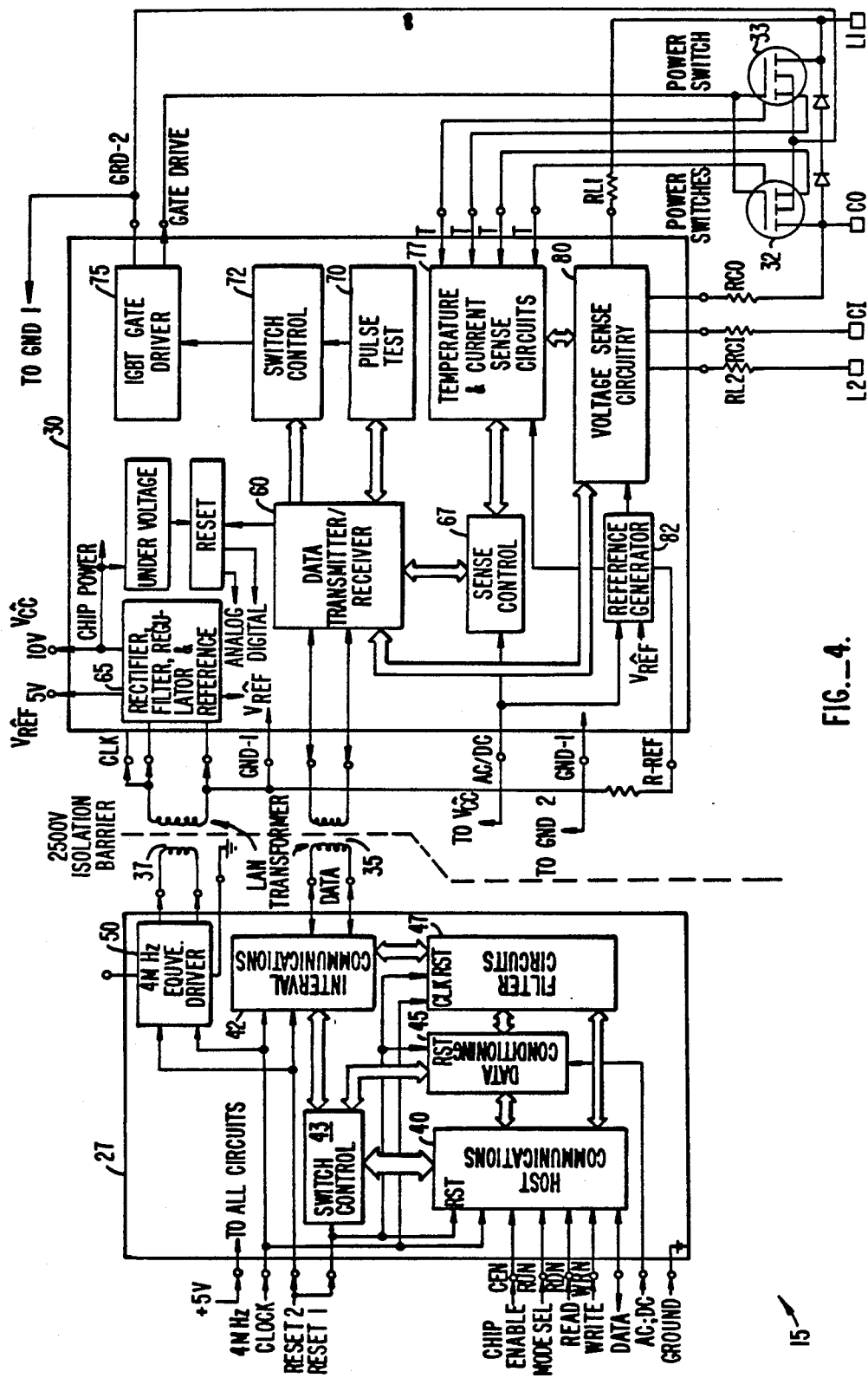
FIG._4.

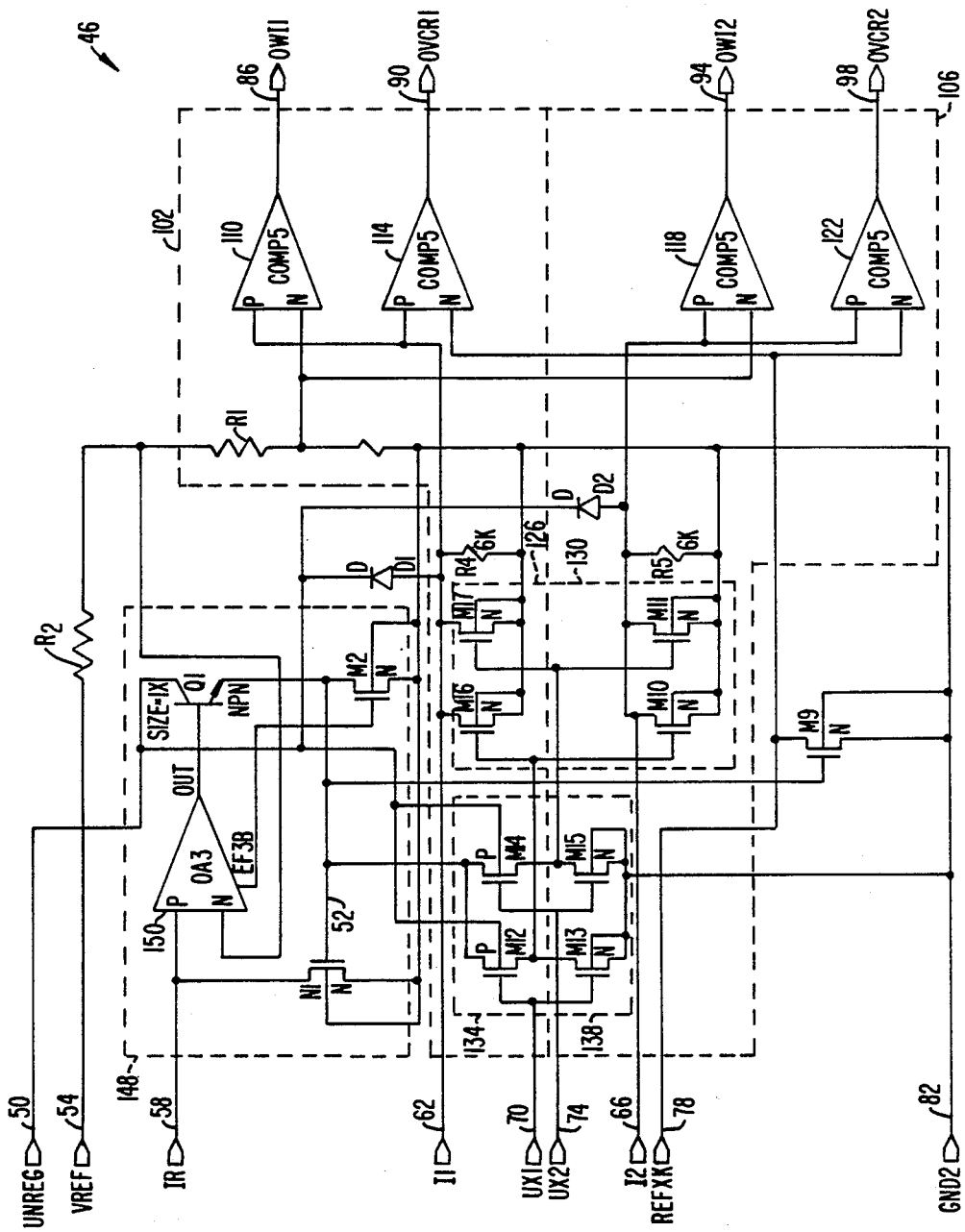
FIG._8.

CIRCUIT FOR SENSING FET OR IGBT DRAIN CURRENT OVER A WIDE DYNAMIC RANGE

BACKGROUND OF THE INVENTION

1. Field Of The Invention

The invention relates generally to currentsensing circuits in an industrial automation system and, more specifically, to a circuit for measuring FET or IGBT drain currents over a wide dynamic range.

2. Description Of The Relevant Art

Reduced to bare essentials, an industrial process may be regarded as having a number of sensors and loads that correspond to input and output variables for a process control computer system. The sensors provide input values representative of the state of the process at a given time; the loads respond to output values, and thereby control various aspects of the process. Typical sensors include relay contacts, proximity switches, and pressure switches. Typical loads include contractor coils of starters for large motors, solenoid valves, relays, lamps, and small motors. A process may have several hundred to several thousand input sensors and loads that must be serviced at very frequent intervals.

A typical computer system for automating an industrial process contains a number of general and special purpose computers. The system monitors input variables from the process, performs suitable logical manipulations on the inputs, and updates output variables for the process. The computer system is usually organized hierarchically. A host processor, typically a minicomputer or a mainframe, communicates with a number of programmable controllers, each of which communicates with a number of local processors and with a number of power control subsystems. A programmable controller is a processor designed specifically to perform logical manipulations on a large number of binary inputs on a cyclical basis. The local pocessors have as their primary function the efficient transfer of data between the power control subsystems and the working memories of the programmable controllers. The power control subsystems provide the interface between the local processors and the various sensors and loads.

One of the parameters frequently monitored by the host processor is current flowing through various components within the system. For example, it is desirable to ensure that excessive current does not flow through any component of the system, because such current frequently indicates a short-circuit or overload condition, which could result in catastrophic failure of the system. Similarly, it is also desirable to ensure that at least a prescribed minimum amount of current is flowing through the system, because the absence of such a minimum amount of current indicates a possible open-wire condition in the system, i.e., some component is not receiving current, or the component is broken, and therefore no current flows through it. It is equally important to detect this condition because automated systems require mechanical components to interact with each other, typically in an interleaving fashion, and if one component is not properly located at a particular time, collision of components may result with equally catastrophic consequences.

Modern industrial automation systems frequently use field-effect transistors (FET's) and insulated gate bipolar transistors (IGBT's) as current switching devices. FIG. 1A shows one such device FET's used in industrial automation systems frequently contain a gate terminal (G), a drain terminal (D), a mirror terminal (M), and a source terminal (S). Current flowing through the mirror terminal (M) ordinarily is a fraction of the overall current flowing through the device, and therefore it is this terminal which frequently is used to measure the current flowing through the device. This is done by placing a sense resistance $R_S$ between the mirror terminal and a ground potential, and then using a comparator to compare the voltage at a node (N) to a reference voltage.

The selected value for sense resistance $R_S$ depends upon the characteristics of the power device. FIG. 1b is a schematic representation of a circuit equivalent to the FET shown in FIG. 1a. As shown therein, the device equivalent circuit comprises a resistance $R_D$, which is the overall resistance between the drain and source of the device. A typical value for $R_D$ is approximately 0.5 ohm. In parallel with $R_D$ is a resistance $R_M$, which is the resistance of the device from the mirror terminal to the drain terminal. A typical value for $R_M$ is approximately 500 ohms. Because of such resistance values, conventional wisdom dictates that $R_S$ should be made as small as possible to measure the mirror current accurately. However, one cannot accurately measure small currents with a small senseresistance because the mirror voltage becomes impractically low (e.g., 50 mV or less). This is especially true when currents below 50 mA (a typical open-wire threshold current) are to be measured. Increasing the size of the sense resistance is not desirable, because the sense resistance $R_S$ then would contribute far more to the current measurement, and hence render the measurement highly inaccurate, if not useless.

One possible technique which attempts to overcome the problems of using large sense resistances, not necessarily in the prior art, is to measure the current flowing through the drain and source terminals of the device as a function of the external drain voltage of the device. However, FIG. 2 shows a graph of IGBT current as a function of external drain voltage and, as shown therein, the zero point of drain current remains at zero for external drain-source voltages greater than zero, and the relationship between the zero point of the external drain voltage and the zero point of the drain current must be known in order to measure accurately. However, the zero point of the external drain voltage is difficult to locate accurately.

SUMMARY OF THE INVENTION

The present invention is directed to a circuit that is capable of accurately measuring currents below 50 mA, as well as large currents on the order of 40 amps or more. This is accomplished by proceeding contrary to the accepted wisdom of the art, and by connecting a large sense resistance to the mirror terminal of an FET or IGBT and using the internal drain voltage and current characteristics to measure very small currents. A small sense resistance is used to measure the larger currents.

In one embodiment of the present invention, two power devices, each having a mirror terminal, are placed in parallel. The mirror terminal of the first power device is coupled to a small sense resistance (approximately 60 ohms), and the mirror terminal of the second power device is connected to a large sense resistance (approximately 6 k ohms). Each mirror terminal is coupled to its own comparator. Thus, small currents may be sensed by the comparator coupled to the mirror terminal of the first power device, whereas large current may be sensed by the comparator coupled to the mirror terminal of the second power device.

If multiple mirror terminals are not available or cannot be fabricated effectively, a large sense resistance is connected to the mirror terminal of the power device for sensing low currents, and a small sense resistance is selectively connected in parallel with the large resistance to provide high current sensing capabilities. Accuracy of such a device is enhanced by suitable circuitry to minimize the effect of integrated impedance variations and variations in the low sense resistance.

BRIEF DESCRIPTION OF THE DRAWINGS

FIG. 1a is a schematic diagram of a conventional power device.

FIG. 1b is a schematic diagram of an equivalent circuit of the power device shown in FIG. 1a.

FIG. 2 is a graph of IGBT current versus external drain-source voltage of the device illustrated in FIG. 1a.

FIG. 3 is a high-level block diagram illustrating the hierarchical structure of a computer system for controlling an automated industrial process.

FIG. 4 is a detailed block diagram of a power control subsystem that interfaces the local processors to the drivers and sensors while providing electrical isolation.

FIG. 5 is a schematic diagram of a power device according to the present invention with a high-resistance sense resistor connected to the mirror terminal.

FIG. 6 is a graph of drain current versus internal source drain resistance of the device of FIG. 5.

FIG. 7 is a schematic diagram of a multiple mirror terminal power device according to the present invention, which is capable of sensing current over a wide dynamic range.

FIG. 8 is a schematic diagram of a circuit according to the present invention for sensing currents over a wide dynamic range when only one mirror terminal is available on the power device.

DETAILED DESCRIPTION OF THE PREFERRED EMBODIMENT

The present invention is drawn to a circuit for measuring FET or IGBT drain currents over a wide dynamic range. As an aid to understanding the environment in which the invention operates, a general description of a factory automation system is set forth below.

Overview of Computer System

FIG. 3 is a high level block diagram of a factory automation computer system. The system has a tree-like configuration with a host processor 12 (typically a mainframe) at the root and a large number of power control subsystems 15 (with associated sensors 17 and loads 18) at the ends of the branches. Host processor 12 and power control subsystem 15 are connected by a network of programmable controllers 20 and local processors 22. Programmable controllers 20 are special purpose processors optimized for performing logical manipulations on large numbers of binary variables. Each programmable controller communicates with a number (e.g., 8 or 16) of local processors, each of which communicates with a number (e.g., 8 or 16) of power control subsystems.

Each power control subsystem 15 includes a system-side portion 15a and a load-side portion 15b that communicates across a 2500-volt isolation barrier 25. During operation, signals from the local processor continuously update the command to apply power to, or remove it from, the load. Likewise, diagnostic data from the sensor is continuously communicated to the local processor.

Overview of Power Control Subsystem

FIG. 4 is a detailed block diagram of one of power control subsystems 15. In a preferred implementation, subsystem 15 comprises a pair of CMOS chips, referred to as system interface chip 27 and load interface chip 30, a pair of MOS power switching devices 32 and 33, one or two isolation transformers, referred to as data transformer 35 and clock transformer 37, and a small number of other discrete components.

System interface chip 27 is a 5-volt CMOS chip which operates on the controller/processor/system side of isolation barrier 25, and it communicates with the host system. Pinout connections include DATA, AC/DC, WRITE, READ, RUN,/ $\overline{\text{PGM}}$, CHIP ENABLE, RESET, and CLOCK, as well as terminals for the transformers and voltage and ground terminals. System interface chip 27 includes host communication circuitry 40, internal communications circuitry 42, switch control circuitry 43, data conditioning circuitry 45, filter circuits 47, and a clock driver 50.

Host communications circuitry 40 provides a bidirectional serial communication link on the DATA line with a protocol easily implemented by most microprocessors. During normal operation, with the RUN/$\overline{\text{PGM}}$ high and CHIP ENABLE low, the host communication circuitry receives a 3-bit serial command word on the DATA line. Pulses on the WRITE line clock the data bits into the chip providing a handshake. The data words are analyzed and, if their pattern or number of bits is incorrect, the data is rejected and the host informed. Similarly, 8-bit status words are transmitted to the host when appropriate handshake clock pulses appear on the READ line. In the programming mode, with RUN/$\overline{\text{PGM}}$ low, 7-bit serial words are transmitted to chip 27 to set the subsystem's default conditions, sense input's set points, and filter time constants, and verification words are returned to the local processor.

Internal communications circuitry 42 is responsible for communicating data across the isolation barrier to load interface chip 30. The link with the load interface chip is via data transformer 35, using Manchester encoding. Internal communications circuitry 42 encodes checked and processed data received from the host, adds a parity bit, and sends the data at 600 Kilobaud to data transformer 35, and hence across the barrier.

Clock driver 50 derives its timing from the CLOCK input (e.g., 4 MHz) and communicates a version of this signal to clock transformer 37, and hence to load interface chip 30. As will be discussed below, the clock signal which is transmitted across clock transformer 37 provides both a clock signal and power to load interface chip 30.

Load interface chip 30 is an 18-volt CMOS chip which operates in conjunction with a pair of MOS switching devices 32 and 33. These are preferably insulated gate bipolar transistors (IGBT's) which, while slower than power MOSFET's, are more rugged and less expensive for a given current carrying capability. Two IGBT's are used for controlling AC power, while only one IGBT is needed for controlling DC power.

The load interface chip includes data transmitting-/receiving circuitry 60, power circuitry 65, sense control circuitry 67, pulse test circuitry 70, switch control circuitry 72, an IGBT gate driver 75, temperature and current sense circuitry 77, voltage sense circuitry 80, and a voltage reference generator 82.

Data transmitting/receiving circuitry 60 and 62 are coupled to the secondary side of data transformer 35 to provide the basic data communication across the isolation barrier. It decodes the incoming data signals, but checks parity before latching. Each byte is transmitted at least twice. Each incoming byte is compared with its predecessor, and its structure is checked for compliance with the Manchester encoding scheme. Similar checking occurs in the reverse direction. Watchdog timers on both chips 27 and 30 alert the subsystem to communication link failure, and put it in a programmed default condition.

Power circuitry 65 is coupled to the secondary of clock transformer 37, and includes on-chip rectifiers, filters, regulators, and references to provide power to the remaining portions of the chip. The 5-volt signal from clock driver 50 on chip 27 is stepped up by clock transformer 37 to a 13-14 volt peak-to-peak waveform. This is rectified and used to develop a 10-volt supply voltage for chip 30 and a 5-volt reference (via a voltage reference generator (82) to set the trip points for current and voltage sensing circuitry 77 and 80.

Switch control circuitry 72 and IGBT gate driver 75 control the gates on the IGBT's. Switch control circuitry 72 is preprogrammed to call for "switch open," "switch closed," or "no change" when the subsystem goes into a default condition. Gate driver 75 can handle capacitive loads up to 5000 pf.

Temperature and current sense circuitry 77 provides signals from temperature sensing diodes and current mirrors on the IGBT's. The current sense trip point can be programmed, but the temperature trip point is fixed. When the permissible die temperature or maximum selected current of either switch is exceeded, it is turned off within two microseconds and the host notified. Temperature and current sense circuitry 77 has the ability to accurately sense currents less than 50 mA. as well as large currents of 40A or more.

Four lines, designated LI, CO, CI, and L2 connect chip 30 and the IGBT's to the load and high voltage line. LI ties the line to one side of the IGBT switch, and CO ties the other side of the IGBT switch to the load. CI connects to the contact of the device sensing load status and through it, if closed, to the line. L2 connects to the low side of the line (e.g., AC common). Four 1-megohm resistors link the four lines to corresponding inputs on voltage sense circuitry 80 where they provide the load status sense inputs. Current difference circuitry in the voltage sense circuitry 80 senses line voltage, customer input voltage, and customer output voltage.

Current Sense Circuitry

For temperature and current sense circuitry 77 to detect open-wire conditions, in addition to over current conditions, it must be capable of sensing currents of less than 50 mA. Although large currents may be sensed using conventional techniques, it is necessary to provide a different circuit to sense small currents, as noted in the Background Of The Invention. To do this, the conventional wisdom of limiting the value of the sense resistance is rejected, and a large sense resistance (e.g., 6 K ohms) is connected to the mirror terminal of a power device 20 as shown in FIG. 5. Although this may eliminate the ability to sense current flowing through the mirror terminal as such, it creates a new possibility for measuring the current flowing through device 20. By connecting a high-value resistance to the mirror terminal of power device 20, the voltage sensed at node N is the internal drain-source voltage of power device 20. Unlike the voltage-current characteristics shown in FIG. 2, the internal drain/source voltage is zero at zero drain current as shown in FIG. 6. Consequently, this internal drain/source voltage may be used to calculate even extremely small drain currents on the order of 50 mA or less. One possible application of this teaching is illustrated in FIG. 7.

FIG. 7 shows a circuit 24 capable of sensing current over a wide dynamic range when two mirror terminals either are available in the packaged device or fabricated by using two devices. As shown in FIG. 7, sensing circuit 24 comprises a power device 28, a power device 32, sense resistances $R_S1$ and $R_S2$, and comparators 36 and 38. The gate, drain, and source terminals of power devices 28 and 32 are connected together. Sense resistance $R_S1$ is connected between a mirror terminal M of power device 28 and the common source terminals, and sense resistance $R_S2$ is connected between the mirror terminal M of power device 32 and the common source terminals. The value for sense resistance $R_S1$ is approximately 6 k ohms, whereas the value of sense resistance $R_S2$ is approximately 60 ohms. Comparator 36 has a first input terminal coupled to a node N1 of power device 20, and a second input terminal coupled to reference voltage source VREF1. Similarly, comparator 38 has a first input terminal coupled to a node N2 of power device 32, and a second input terminal coupled to a reference voltage source VREF2. VREF1 is calculated to trigger comparator 36 when the internal drain-source voltage appearing at node N1 exceeds a prescribed value, whereas the reference voltage source VREF2 is calculated to cause comparator 38 to trigger when the mirror terminal voltage at node N2 exceeds a prescribed value.

If multiple mirror terminals are unavailable, then the circuit illustrated in FIG. 8 may be used. FIG. 8 is a detailed schematic of a sensing circuit 46, according to the present invention, which selectively connects a low-impedance resistance in parallel with a high-impedance resistance connected to the mirror terminal of a power device. High current thus may be sensed when the low-impedance resistance is connected to the high-impedance resistance, whereas low current may be measured when the low-impedance resistance is disconnected from the high-impedance resistance. The teachings of FIG. 8 are specifically directed to systems which employ AC switches, but may be easily modified to handle DC currents. Additionally, the teachings of FIG. 8 may be applied to FIG. 7 to convert that circuit into one capable of sensing alternating currents.

Sensing circuit 46 receives unregulated voltage and current from power circuitry 65 (FIG. 4) over a VUNREG line 50, a 5-volt reference voltage from reference generator 82 over a VREF line 54, a first reference current over an IR line 58, mirror current over an I1 line 62 and an I2 line 66, multiplexing signals over MUX1 line 70 and MUX2 line 74, a second reference current over an IREFXK line 78, and a ground potential over a GND2 line 82. From these inputs, sensing circuit 46 provides a first open-wire indicating signal on an OWI1 line 86, a first over-current signal on an OVCR1 line 90, a second open-wire indicating signal over an OWI2 line 94, and a second over-current signal over an OVCR2 line 98. The reason for the first and second open-wire and over-current signals is because this embodiment of sensing circuit 46 processes AC signals. The first open-wire and over-current signals are issued for the positive portion of the AC signal (received over I1 line 62), whereas the second open-wire and over-current signals are produced for the negative portion of the AC signal (received over I2 line 66). If the circuit is to be used for DC currents, then the second open-wire and over-current signals appearing on OWI2 line 94 and OVCR2 line 98 are unused.

Sensing circuit 46 is divided into a positive signal section 102 and a negative signal section 106. Positive signal section 102 processes the positive portion of the AC signal, whereas negative signal section 106 processes the negative portion of the AC signal. Positive signal section 102 receives positive current flow from the mirror terminal of the power device over I1 line 62. I1 line 62 is connected to the positive input terminals of open-wire comparator 110 and over-current comparator 114. Similarly, negative signal section 106 receives current from the mirror terminal of the power device over I2 line 66, which, in turn, is connected to the positive input terminals of open-wire comparator 118 and over-current comparator 122. The negative input terminal of open-wire comparator 110 and open-wire comparator 118 are connected for receiving a reference voltage over VREF line 54 through resistors R1 and R2. The negative input terminals of over-current comparators 114 and 122 are connected to IREFXK line 78 for providing the threshold voltage for over-current situations.

The sense resistors for sensing small current are provided by resistors R4 and R5, which are connected between I1 line 62 and I2 line 66, respectively, and GND2 line 82. For selectively connecting a low resistance in parallel with resistors R4 and R5, positive signal section 102 and negative signal section 106 include resistor switch sections 126 and 130, respectively. Rather than attempt to connect actual resistors to resistors R4 and R5, transistors are used in this embodiment for their switching capabilities. The resistance of the transistors themselves comprises the low resistance. Resistor switch section 126 comprises transistors M16 and M17, each of which has its drain terminal connected to I1 line 62 and its source terminal connected to GND2 line 82. Similarly, resistor switch 130 comprises transistors M10 and M11, each of which has its drain terminal connected to I2 line 66 and its source terminal connected to GND2 line 82. Thus, when the transistors within resistor switches 126 and 130 are switched on, the resistance of the transistors becomes dominant, whereas when the transistors within resistor switches 126 and 130 are turned off, the 6K resistors R4 and R5 become dominant.

For accuracy over a wider range of sensed currents, two transistors are used in each resistor switch, each transistor having a resistance of 60 ohms. Thus, either 30 or 60 ohms may be placed in parallel with the 6K resistors R4 and R5 depending on sensing requirements. The reason for this is that resistance $R_S$ must be chosen optimally for resistances $R_D$ $R_M$. That is because if resistance $R_S$ is too high, the apparent mirror ratio causes accuracy problems. On the other hand, if sense resistance $R_S$ is too small, mirror voltage becomes impractically low and subject to noise and inaccuracy in measurement. Since resistances $R_D$ and $R_M$ obey the voltage/current relationship shown in FIG. 6, sense resistance $R_S$ also should vary accordingly. Therefore, by providing two transistors, the value of sense resistance $R_S$ may be altered according to the current level in the power device for optimum accuracy. This is a means of accurately sensing device current over the range of medium to high currents. This also increases the dynamic range of accurate measurement. Of course, more transistors may be added if desired.

The transistors within resistor switch 126 and 130 are controlled by multiplexer sections 134 and 138, respectively. Multiplexer sections 134 and 138 comprise a pair of CMOS devices, wherein the PMOS devices are located in multiplexer section 134 and the NMOS devices are located in multiplexer section 138. A PMOS device M12 and an NMOS device M13 have their gates connected to MUX1 line 70, whereas a PMOS device M14 and an NMOS device M15 have their gates connected to MUX2 line 74. The source terminals of PMOS devices M12 and M14 are connected together and to a control line 52, and the source terminals of NMOS devices M13 and M15 are connected together and to GND2 line 82. The drain terminal of PMOS device M12 is connected to the drain terminal of NMOS device 13 and to the gate terminal of transistors M16 and M10 in resistor switch sections 126 and 130, respectively. The drain terminal of PMOS device M14 is connected to the drain terminal of NMOS device M15 and to the gate terminals of transistors M17 and M11 in resistor switch sections 126 and 130, respectively. Current flowing through PMOS device M12 and NMOS device M13 control transistors M16 and M10, respectively, whereas current flowing through PMOS device M14 and NMOS device M15 control transistors M17 and M11, respectively. Thus, transistors M16 and M10 are selectively turned on by the signals applied to MUX1 line 70, and transistors M17 and M11 are selectively turned on by signals applied to MUX2 line 74.

Because of process, thermal, and voltage impedance variations within the integrated circuit containing sensing circuit 46, there is a substantial risk that, even though the sensed currents initially may be accurate, the accuracy will fluctuate over time. Since accuracy is critical when measuring current on the order of 50 mA or less, it is critical to eliminate such variations as much as possible. This is accomplished in the present invention by using the reference currents flowing through IR line 58 and IREFXK line 78 to control the reference voltages at comparators 110, 114, 118, and 122. To control integrated impedances within the chip for accurate sensing of over-current situations, a transistor M9 is connected between IREFXK line 78 and GND2 line 82 for adjusting the reference voltage applied to comparators 114 and 122. Transistor M9 is matched to transistors M16, M17, M10, and M11. Thus, if Z1 equals the impedance characteristics of transistor M9, and if Z2 equals the impedance characteristics of transistors M16 and M17, then, when comparators 114 and 122 are at the switch point, I1 (or I2) = $Z2/Z1 \times IREF$. From this equation, it is clear that the impedance variations of Z1 and Z2 cancel, and hence the comparator switch point is a function of the current flowing through IREFXK line 78 and is not a function of temperature variations in Z1 and Z2 or the other undesirable factors noted above. The reference current therefore is scaleable to provide an accurate reference voltage for comparators 114 and 122.

To stabilize the voltages at the gates of transistors M16, M17, M10, and M11 so that the sensing scheme is accurate with medium and large currents flowing through the mirror terminal, a stabilizing network 148 is provided. Stabilizing network 148 comprises an op amp 50, a transistor Q1, a transistor M1, and a transistor M2. The inverting input terminal of op amp 150 is coupled to VREF line 54 through resistor R2 for receiving a reference voltage therefrom. Transistor M2 functions to bias transistor Q1. Transistor Q1 and op amp 150, by virtue of the virtual short between the inverting and non-inverting input terminals of OP amp 150, servo transistor M1 to transfer the reference voltage from the inverting input terminal of OP amp 150 to transistors M16, M10, M17, and M11 via transistors M12 and M14, respectively. Consequently, stabilizing circuit 148 avoids changes in the apparent mirror ratio of thr power device caused by variations in the impedance of transistors M16, M17, M10, and M11 which correspond to $R_S$ in FIG. 1B.

While the above is a complete description of a preferred embodiment of the present invention, various modifications may be employed. Consequently, the scope of the invention should not be limited except as described in the claims.

I claim:

1. A circuit for sensing very small currents flowing through an FET having a source terminal, a drain terminal, and a mirrow terminal comprising:
   a comparator having a first input terminal coupled to the mirror terminal of the FET and a second input terminal coupled to a reference voltage;
   a high resistance coupled between the mirror terminal of the FET and a ground potential; and
   wherein the high resistance is greater than the source to drain resistance of the FET.

2. A circuit for sensing currents over a wide dynamic range comprising:
   a first FET having a source terminal, a mirror terminal, and a drain terminal;
   a second FET having a source terminal connected to the source terminal of the first FET, a mirror terminal, and a drain terminal connected to the drain terminal of the first FET;
   a first comparator having a first input terminal coupled to the mirror terminal of the first FET and a second input terminal coupled to a first reference voltage;
   a second comparator having a first input terminal coupled to the mirror terminal of the second FET and a second input terminal coupled to a second reference voltage;
   a low resistance coupled between the mirror terminal of the first FET and a ground potential;
   a high resistance coupled between the mirror terminal of the second FET and a ground potential;
   wherein high currents are sensed by the first comparator, and low currents are sensed by the second comparator.

3. The circuit according to claim 2 wherein the low resistance is less than the mirror-to-drain resistance of the first FET.

4. The circuit according to claim 2 wherein the high resistance is greater than the mirror-to-drain resistance of the second FET.

5. A circuit for sensing currents over a wide dynamic range comprising:
   a power transistor having a source terminal, a drain terminal, and a mirror terminal;
   a comparator having a first input terminal coupled to the mirror terminal and a second input terminal coupled to a reference potential;
   a high resistance coupled between the mirror terminal and a ground potential;
   a low resistance;
   multiplexing means, coupled to the low resistance and to the mirror terminal, for selectively coupling the low resistance between the mirror terminal and a ground potential and in parallel with the high resistance.

6. The circuit according to claim 5 wherein the low resistance comprises a transistor.

7. The circuit according to claim 5 wherein the high resistance is higher than the mirror-to-drain resistance of the power transistor.

8. The circuit according to claim 5 wherein the low resistance is lower than the mirror-to-drain resistance of the power transistor.

9. The circuit according to claim 6 further comprising a reference resistance coupled between the second input terminal of the comparator and a ground potential.

10. The circuit according to claim 9 further comprising a voltage-to-current converter, coupled between the reference potential and the second input terminal of the comparator, for converting the reference voltage to a reference current, the reference current flowing through the reference resistance.

11. The circuit according to claim 10 wherein the reference resistance has substantially the same resistance value as the low resistance.

12. The circuit according to claim 11 wherein the reference resistance comprises a transistor.

13. The circuit according to claim 12 wherein the low resistance comprises a low impedance transistor having a gate, a source, and a drain, and wherein the multiplexing means couples the source and drain of the low impedance transistor between the first input terminal of the comparator and the ground potential.

14. The circuit according to claim 11 further comprising stabilizing means for stabilizing the potential at the gate of the low impedance transistor.

15. The circuit according to claim 14 wherein the stabilizing means comprises an operational amplifier having a first input terminal coupled to a second reference potential and a second input terminal coupled to a constant current source.

16. The circuit according to claim 15 wherein the stabilizing means further comprises a stabilizing transistor coupled between the second input terminal of the operational amplifier and a ground potential, the stabilizing transistor having a gate terminal coupled to an output terminal of the operational amplifier.

17. The circuit according to claim 16 wherein the multiplexing means couples a gate voltage of the stabilizing transistor to the gate of the low impedance transistor.

18. A circuit for sensing currents on the order of 50 mA flowing through a transistor having an input terminal, an output terminal and a mirror terminal comprising:
   a comparator having a first input terminal coupled to the mirror terminal of the transistor and a second input terminal coupled to a reference voltage; and
   a resistance coupled between the mirror terminal of the transistor and a ground potential, the resistance being sufficiently large so that a voltage at a node between the mirror terminal and the resistance is substantially equal to an internal voltage between the input terminal and the output terminal.

* * * * *